United States Patent [19]

Moorey

[11] 4,109,205

[45] Aug. 22, 1978

[54] FREQUENCY MODULATION SIGNALLING SYSTEM EMPLOYING AN ELECTRICAL FILTER DEVICE

[75] Inventor: Ernest James Moorey, Ivybridge, England

[73] Assignee: M. L. Engineering (Plymouth) Limited, Slough, England

[21] Appl. No.: 674,722

[22] Filed: Apr. 6, 1976

[30] Foreign Application Priority Data

Apr. 12, 1975 [GB] United Kingdom ............... 15123/75

[51] Int. Cl.$^2$ ..................... H04B 1/00; H04B 7/24
[52] U.S. Cl. .................................. 325/45; 246/30; 325/37; 325/64; 330/109; 331/113 R; 343/225
[58] Field of Search ............... 330/109, 112, 207 P; 325/64, 45, 37, 344, 349; 246/29 R, 30, 167 R, 182 B, 187 C; 343/225, 228; 331/108 R, 108 A, 111, 113 R, 114

[56] References Cited

U.S. PATENT DOCUMENTS

| | | | |
|---|---|---|---|
| 2,983,876 | 5/1961 | Tongue | 330/112 |
| 3,264,572 | 8/1966 | Lefferts | 330/112 |
| 3,366,961 | 1/1968 | Goldstein | 325/37 |
| 3,725,802 | 4/1973 | Darrow | 330/109 |
| 3,792,376 | 2/1974 | Pederson et al. | 331/113 R |

*Primary Examiner*—Robert L. Griffin
*Assistant Examiner*—Marc E. Bookbinder
*Attorney, Agent, or Firm*—Cushman, Darby & Cushman

[57] ABSTRACT

An electrical fail-safe filter consists of a transistor amplifier with a frequency-selective positive feedback circuit such as a resistance capacitance network shunting the collector and emitter of the transistor such that failure of any component of the feedback circuit results in a reduction in the overall gain of the stage. The filter is described in its application to a fail-safe receiver for a railway signalling system.

5 Claims, 3 Drawing Figures

FREQUENCY MODULATION SIGNALLING SYSTEM EMPLOYING AN ELECTRICAL FILTER DEVICE

This invention relates to electrical filter devices for use in fail-safe electrical signalling systems.

It is a well known requirement of railway electrical signalling systems that all the individual component units of the system should have fail-safe operating characteristics, so that in the event of failure of any component unit of the system the associated railway signals are always set at "danger" automatically.

An object of the invention is to provide an electrical filter device, suitable for use in an electrical signalling system, which is essentially fail-safe in operation.

According to the present invention there is provided an electrical filter device comprising a transistor amplifier stage having a frequency selective positive feedback circuit responsive to a predetermined frequency, and so arranged that failure of any component of the feedback circuit results in a reduction in the overall gain of the stage.

The filter device according to the invention is such that in the event of failure of any circuit component the filter device ceases to function and does not provide an output signal. Thus the reduction in gain of the amplifier stage in the event of component failure, in the extreme case the reduction of the amplifier output to zero, enables the filter device of the present invention to be used, for example in a signalling system of the kind referred to above, in a fail-safe manner.

Preferably the positive feedback circuit comprises a resistance-capacitance network including a first capacitor shunting the collector and emitter of the transistor amplifier stage. The positive feedback resistance-capacitance network may include a second capacitor shunting a resistive emitter load of the transistor amplifier stage.

The present invention also comprehends a filter device as herein defined incorporated in an electrical signalling system comprising a transmitter station having a signal generator arranged to generate an electrical oscillatory signal of a predetermined fundamental frequency, means for transmitting the said signal over a line or radio link to a receiving station, modulation means at the transmitter station for frequency-modulating, the said signal with a preselected modulation signal, demodulation means at the receiver station for extracting the modulation signal and passing the demodulated signal to the filter device, which is tuned to the modulation signal frequency and adapted when operative to provide a corresponding output signal only when said modulation signal is present in sufficient amplitude, and timer means adapted to provide an output only when the said output signal of the filter device is present for a predetermined time interval.

Since the system fails to provide an output when the filter means is inoperative, the system is fail-safe in this respect.

The present invention in another aspect provides a square wave generator comprising a resistance-capacitance circuit including at least one capacitor in series with at least one resistor, first and second transistor switching elements operative to connect the said circuit to two different stabilised voltages, and third and fourth transistor switching elements connected to opposite sides of the said capacitor from the first and second switching elements and connected to the first and second switching elements respectively so that the third switching element conducts when the first switching element conducts to cause charging of the capacitor or capacitors in one sense and the fourth switching element conducts when the second switching element conducts, to cause charging of the capacitor or capacitors in the opposite sense, with the same time constant, and an output circuit connected to the resistance-capacitance to derive therefrom a square wave voltage output with a mark-to-space ratio of substantially unity.

The output of the square wave generator will maintain an accurate mark-to-space ratio of 1:1, irrespective of variations in the supply voltage, since substantially identical resistance-capacitance circuits are used to provide each half cycle of the square wave.

The invention will now be described, by way of example, with reference to the accompanying purely diagrammatic drawings, in which.

Figure 1:
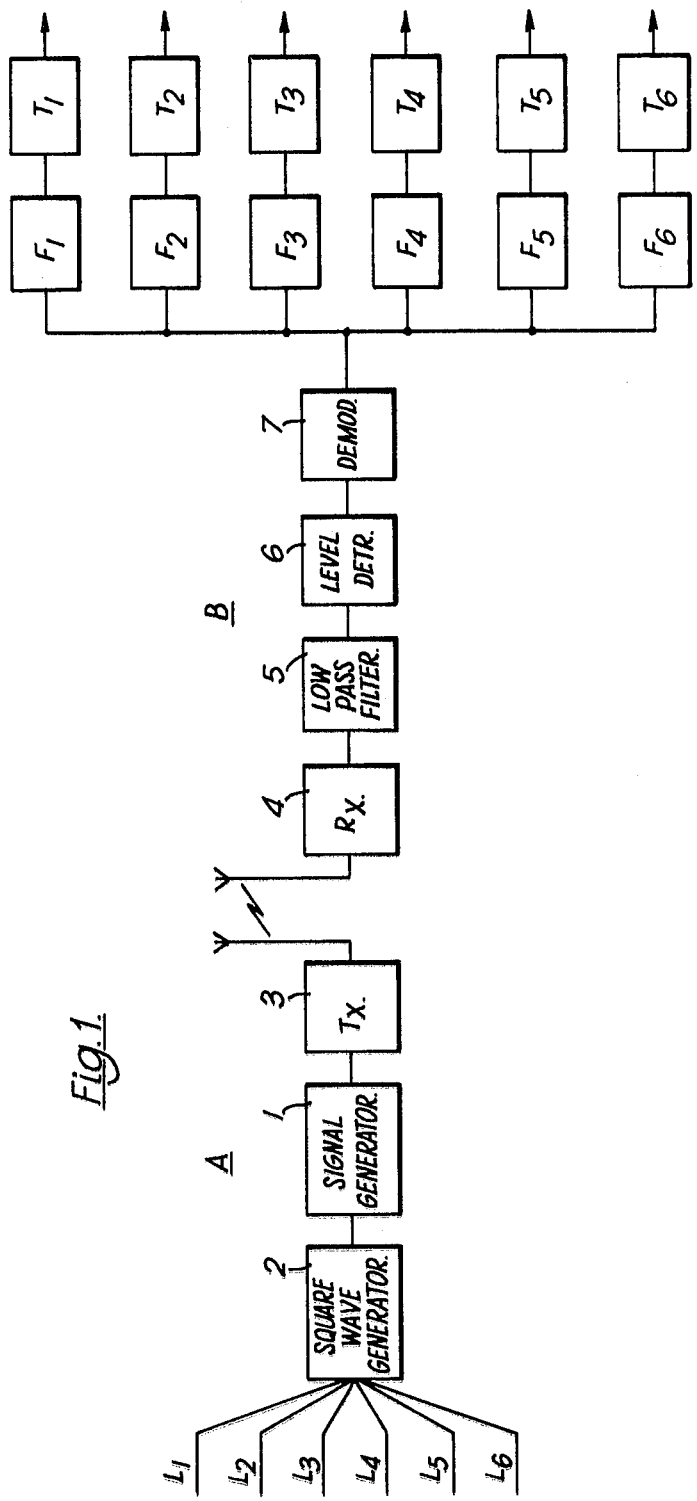
FIG. 1 is a schematic block diagram of part of a signalling system incorporating filter devices according to the invention.

FIG. 1 illustrates diagrammatically part of a railway signalling system for the transmission of electrical signals between two stations A and B, such as, for example, two successive signal boxes along a track, or two trains on a track, or a train and a signal box. For simplicity of illustration the system is shown as having a transmitter at station A and a receiver at station B, at opposite ends of a section of railway track (not shown). It will be appreciated that in practice each of the stations A and B will have both a transmitter and a receiver so that signals can be transmitted between stations in both directions.

As illustrated schematically in FIG. 1 the transmitter unit at station A includes a signal generator 1 which generates an oscillatory high frequency signal of a predetermined fundamental frequency. This fundamental frequency is frequency-modulated at a preselected modulation frequency by a low frequency modulation signal derived from a low frequency modulation signal generator 2. The selected modulation frequency provided by the low frequency generator 2 is chosen according to the function to be signalled to the receiver station. The modulated output of the signal generator 1 is applied to a radio transmitter 3 which converts the signal into a modulated radio signal for transmission to the station B at the other end of the track section. At the station B a radio receiver 4 receives and demodulates the radio signal.

The radio signal transmitted between the stations A and B includes, in addition to the frequency modulated signal output of the generator 1, an audio signal carrier, which may be amplitude- or frequency-modulated for the transmission of speech over the radio link between the two stations. The audio signal after reception in the receiver 4 is demodulated and amplified by any known convenient means, the audio carrier frequency being removed by a low pass filter 5 which is followed by an amplitude or level detector 6.

The level detector 6 passes the frequency modulated signal only if the amplitude of the latter exceeds a predetermined threshold level. If the signal is too weak, or if no signal is present, the level detector 6 does not provide an output and the system cannot therefore operate to provide a "go" or "green" condition.

Following the level detector 6 the frequency modulated signal passes into a demodulator 7 and the resulting demodulated signal is then subjected to frequency selective filtering by a low frequency filter tuned to the selected modulation frequency. In the system illustrated in FIG. 1, applied to railway signalling, the modulation frequency can have one of six different preselected values, determined by the operation of associated block relays (not shown), according to the operational state of the associated track section. These six different states are designated by six different input lines $L_1$–$L_6$ to the low frequency signal generator 2, representing different predetermined modulation frequencies, selected as described later with reference to FIG. 2. With each of these modulation frequencies there is associated a different low frequency filter, designated $F_1$–$F_6$ respectively in FIG. 1.

After transmission through the respective low frequency filter $F_1$–$F_6$ the signal is timed for a predetermined minimum time interval, by a respective timer $T_1$–$T_6$. If the output signal of the filter $F_1$–$F_6$ persists for longer than the predetermined minimum time interval determined by the associated timer $T_1$–$T_6$ the latter provides an output signal which after amplification is used to energise an associated block relay (not shown) at the station B, corresponding with the respective block relay at the station A which initiated the signal transmission. Since the timer circuits $T_1$–$T_6$ pass only signals of longer than a predetermined minimum duration the energisation of the relays by spurious signals or transients is effectively avoided.

To ensure that interference does not cause a spurious operation of the relays in the receiver station each received signal must fulfil the following conditions in order to energise the associated relay: (i) The signal amplitude must exceed a predetermined minimum level; (ii) predetermined frequencies must be detected in the received signal, in this case the two extreme frequencies; (iii) the signal must be present for at least a predetermined time interval; (iv) the mark-to-space ratio of the modulation signal must be unity, and (v) the modulation rate, in this case the square wave repetition frequency, must be of the correct value.

Figure 2:
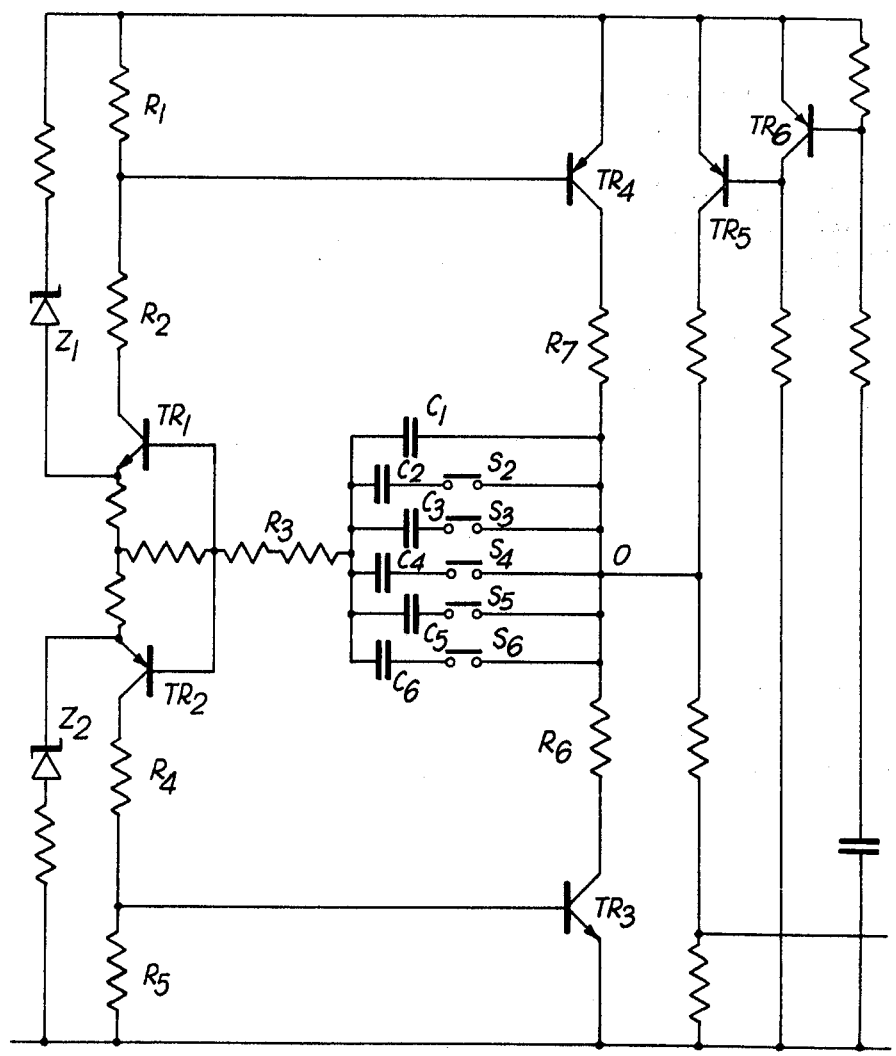
FIG. 2 is a circuit diagram of a low frequency square wave generator, according to an aspect of the invention, employed in the system of FIG. 1.

FIG. 2 illustrates a typical circuit of the low frequency modulation signal generator 2 employed in the system of FIG. 1. The generator of FIG. 2 is designed to provide a square wave output with a 1:1 mark-to-space ratio. The generator includes a resistance-capacitance circuit having six capacitors $C_1$–$C_6$, corresponding to the six different signal frequencies to be transmitted, which are selectively connectible according to the selected modulation frequency, in a resistive charging circuit comprising resistors $R_1$–$R_7$ by selective closure of associated relay-operated switches $S_2$–$S_6$, the capacitor $C_1$ being permanently connected in the charging circuit. Two switching transistors $TR_1$, $TR_2$ are arranged in series across a direct current power supply with their bases interconnected and connected to the resistance-capacitance circuit, the emitter voltages of the two transistors being maintained at the correct level with respect to the power supply voltage by respective zener diodes $Z_1$, $Z_2$. Both transistors $TR_1$ and $TR_2$ are normally reverse-biased (i.e. cut-off) by the respective voltages at their emitters. In the normal or quiescent condition of the circuit the voltage at an output point O connected to the opposite side of the capacitive charging circuit from the transistors $TR_1$, $TR_2$, remains static at a voltage intermediate the voltages provided by the two zener diodes $Z_1$, $Z_2$. The output point O is connected to the negative supply rail through resistor $R_6$ and transistor $TR_3$, and is also connected to the positive supply rail through resistor $R_7$ and transistor $TR_4$. In the quiescent state both transistors $TR_3$ and $TR_4$ are cut-off.

Oscillation of the circuit shown in FIG. 2 is commenced by switching on the transistor $TR_3$, by means of a starting impulse provided by a starting circuit $TR_5$, $TR_6$. Once $TR_3$ is conducting, the current through the transistor $TR_3$ causes the transistor $TR_1$ to conduct, so that the selected capacitance $C_1$–$C_6$ charges through the resistive charging circuit, including resistors $R_1$, $R_2$, $R_3$, $R_6$, until the current flow through the capacitor falls to such a level as to cut-off the transistor $TR_1$. When the transistor $TR_1$ switches off transistor $TR_2$ is switched on and a reverse charging cycle commences, with transistor $TR_4$ conducting and transistor $TR_3$ cut-off, with a resistive charging circuit including resistors $R_7$, $R_3$, $R_4$, $R_5$.

For an output having a mark-to-space ratio of unity the resistors $R_1$, $R_2$, $R_4$ and $R_5$ should have identical resistances and the resistors $R_6$ and $R_7$ identical resistances also. In this case the selected capacitor charges in both directions through substantially identical resistive charging circuits and mark and space intervals of the resulting square wave voltage at the output point O will be identical. Moreover, the frequency of the square wave will be independent of the power supply.

If either of the zener diodes $Z_1$, $Z_2$ is open-circuited the output to the associated output transistor $TR_3$, $TR_4$ is removed. If either of the zener diodes is short-circuited then the voltage between the emitters of the transistors $TR_1$ and $TR_2$ is increased. In each case the oscillations will cease.

In the event of leakage current into the resistance-capacitance timing circuit through either transistor $TR_1$ or transistor $TR_2$ the resulting current through the resistor $R_6$ or $R_7$ will be such that the respective transistor $TR_3$ or $TR_4$ will never switch off and oscillations cannot occur.

In a typical practical embodiment of the low frequency signal generator of FIG. 2 the selected modulation frequency would be in the range 1-6 Hz, and the illustrated components would have the following values:

$R_1 = R_2 = R_4 = R_5 = R_6 = R_7 = 100$ Kohm
$R_3 = 27$ Kohm
$C_1 = 0.01$ $\mu$F; $C_2 = 1$ $\mu$F; $C_3 = 1.5$ $\mu$F;
$C_4 = 2.2$ $\mu$F; $C_5 = 3.8$ $\mu$F; $C_6 = 4.7$ $\mu$F.

Figure 3:
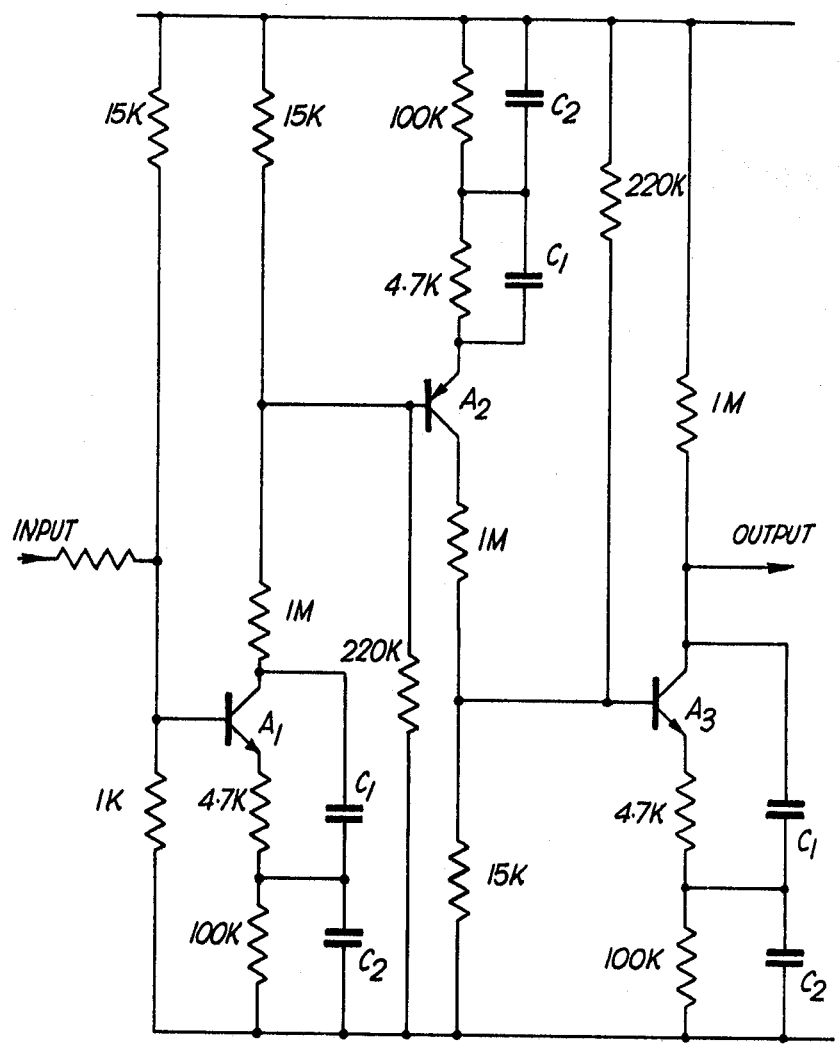
FIG. 3 is a circuit diagram of a low frequency fail-safe filter device according to one embodiment of the invention.

FIG. 3 illustrates a typical low frequency filter circuit according to the invention, which may be used for each of the low frequency filters $F_1$–$F_6$ shown in FIG. 1. The illustrated filter circuit consists of three successive transistor amplifier stages $A_1$, $A_2$, $A_3$ each of which is provided with a positive feedback network including a capacitor $C_1$ shunting the collector and emitter of the transistor, and a second capacitor $C_2$ shunting a resistive emitter load of the transistor. This circuit arrangement has a very low Q, and since the transistor itself cannot have a collector/emitter current gain greater than 1, it cannot commence oscillation, notwithstanding the positive feedback through the capacitor $C_1$.

In practice the filter device could comprise a single transistor amplifier stage with positive feedback, corresponding to one only of the stages shown in FIG. 3.

The frequency selective feedback network of each transistor amplifier stage $A_1$, $A_2$, $A_3$ is effective to provide positive feedback at the selected filter frequency and is arranged so that failure of any component of the transistor circuit will result in a reduced output, below the level sufficient to provide an output from the associated timer $T_1$–$T_6$ (FIG. 1) which is connected to the last amplifier stage of the filter.

Each timer $T_1$–$T_6$ may include a level detector to which the output of the last amplifier stage of the associated filter $F_1$–$F_6$ is connected through a respective buffer stage. Once the voltage at the output from the associated filter $F_1$–$F_6$ exceeds a predetermined threshold the timer commences the timing of a predetermined interval before operating the associated relay at the station 3.

A timer circuit of the kind described and illustrated in the Complete Specification of our U.K. Patent application 12116/74 may be employed for each timer $T_1$–$T_6$. A suitable timer circuit for each timer $T_1$–$T_6$ may comprise a fail-safe electronic timing circuit comprising a threshold device having a biasing network such that the device is normally in a first state, a timing capacitor connected to the biasing network, two switching devices connected to opposite sides of the capacitor, and means for closing the switching devices for fixed intervals in alternation to refer the opposite sides of the capacitor alternately to a reference potential during the intervals, so that the capacitor is charged progressively in a number of steps in operation of the circuit to cause a potential at the biasing network of the threshold device to cross a threshold potential level after a predetermined interval, so as to place the device in a second state, the device remaining in its first state in the event of failure of the capacitor.

It will be understood that the two stations A and B referred to in the preceding description may be interconnected by any convenient signal transmission means instead of the radio link illustrated. Thus signals could alternatively be transmitted between the stations along a line or along part of a railway track.

I claim:

1. An electrical signalling system comprising:
    a transmitter station having a signal generator arranged to generate an electrical oscillatory signal of a predetermined fundamental frequency;
    modulation means at the transmitter station for frequency-modulating the said signal with a preselected modulation signal frequency including a resistance-capacitance circuit including a capacitor in series with a resistor, first and second transistor switching elements operative to connect the said circuit to two different stabilized voltages and third and fourth transistor switching elements connected to opposite sides of the said capacitor from the first and second switching elements and connected to the first and second switching elements respectively whereby in operation the third switching element conducts when the first switching element conducts to cause charging of said capacitor through the said resistor in one sense and the fourth switching element conducts when the second switching element conducts, to cause charging to reverse the polarity of said capacitor through the said resistor in the opposite sense, with the same time constant, and an output circuit connected to the resistance-capacitance circuit to derive therefrom a square wave voltage output with a mark-to-space ratio of substantially unity;
    means for transmitting the said signal;
    a receiving station for receiving said signal;
    demodulation means at the receiver station for extracting the modulation signal frequency;
    a filter device connected to the demodulation means, said filter device being tuned to the said modulation signal frequency and providing a corresponding output signal only when said modulation signal is present in sufficient amplitude; and
    timer means adapted to provide an output only when the said output signal of the filter device is present for a predetermined time interval, the said filter device comprising a transistor amplifier stage having a frequency selective positive feedback circuit responsive to said modulation signal frequency, and such that failure of any component of the feedback circuit results in a reduction in the overall gain of the amplifier stage.

2. The filter device defined in claim 1, wherein the transistor amplifier stage comprises a transistor having a collector and an emitter and an emitter resistor and the positive feedback circuit comprises a resistance-capacitance network including a first capacitor connected between the collector of said transistor and the emitter resistor.

3. The filter device defined in claim 2, wherein the transistor amplifier stage has a resistive emitter load and the positive feedback resistance-capacitance network includes a second capacitor shunting the said resistive emitter load.

4. An electrical signalling system comprising:
    a transmitter station having a signal generator arranged to generate an electrical oscillatory signal of a predetermined fundamental frequency;
    means for transmitting the said signal;
    a receiving station for receiving said signal;
    modulation means at the transmitter station for frequency-modulating the said signal with a preselected modulation signal frequency;
    demodulation means at the receiver station for extracting the modulation signal frequency;
    a filter device connected to the demodulation means, said filter device being tuned to the said modulation signal frequency and providing a corresponding output signal only when said modulation signal is present in sufficient amplitude;
    timer means dapted to provide an output only when the said output signal of the filter device is present for a predetermined time interval, the said modulation means comprising a square wave generator including a resistance-capacitance circuit having a capacitor in series with a resistor;
    first and second transistor switching elements operative to connect the said circuit to two different stabilized voltages; and
    third and fourth transistor switching elements connected to opposite sides of said capacitor from the first and second switching elements and connected to the first and second switching elements respectively whereby in operation the third switching element conducts when the first switching element conducts to cause charging of said capacitor through the resistor in one sense and the fourth switching element conducts when the second switching element conducts, to cause charging to reverse the polarity of said capacitor through the resistor in the opposite sense, with the same time constant, and an output circuit connected to the resistance-capacitance circuit to derive therefrom a square wave voltage output with a mark-to-space ratio of substantially unity.

5. A signalling system as claimed in claim 4, wherein the filter device comprises a transistor amplifer stage having a frequency selective positive feedback circuit responsive to the modulation signal frequency.

* * * * *